US005771264A

United States Patent [19]
Lane

[11] Patent Number: 5,771,264
[45] Date of Patent: Jun. 23, 1998

[54] DIGITAL DELAY LOCK LOOP FOR CLOCK SIGNAL FREQUENCY MULTIPLICATION

[75] Inventor: Chris Lane, Campbell, Calif.

[73] Assignee: Altera Corporation, San Jose, Calif.

[21] Appl. No.: 779,897

[22] Filed: Jan. 7, 1997

Related U.S. Application Data

[60] Provisional application No. 60/025,101, Aug. 29, 1996.
[51] Int. Cl.[6] ..................................................... H03D 3/24
[52] U.S. Cl. ........................ 375/376; 375/373; 375/374; 375/377; 327/158; 327/160
[58] Field of Search ..................................... 329/313, 318, 329/319; 331/1 R, 12, 18, 25, 64; 327/158–162, 141; 375/374, 373, 376, 377

[56] References Cited

U.S. PATENT DOCUMENTS

| | | | |
|---|---|---|---|
| 3,961,282 | 6/1976 | Chen et al. | 331/1 R |
| 4,309,673 | 1/1982 | Norberg et al. | 328/134 |
| 4,338,569 | 7/1982 | Petrich | 328/155 |
| 4,609,986 | 9/1986 | Hartmann et al. | 364/200 |
| 4,617,479 | 10/1986 | Hartmann et al. | 307/465 |
| 4,677,318 | 6/1987 | Veenstra | 307/465 |
| 4,689,581 | 8/1987 | Talbot | 331/1 A |
| 4,713,792 | 12/1987 | Hartman et al. | 364/900 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,121,006 | 6/1992 | Pedersen | 307/465 |
| 5,241,224 | 8/1993 | Pedersen et al. | 307/465 |
| 5,260,610 | 11/1993 | Pedersen et al. | 307/465 |
| 5,260,611 | 11/1993 | Cliff et al. | 307/465 |
| 5,350,954 | 9/1994 | Patel | 307/465 |
| 5,420,592 | 5/1995 | Johnson | 342/357 |
| 5,488,641 | 1/1996 | Ozkan | 375/376 |
| B1 4,617,479 | 9/1993 | Hartmann et al. | 307/465 |

OTHER PUBLICATIONS

Dr. Dao–Long Chen, "Designing on–Chip Clock Generators", Circuits and Devices, Jul. 1992, pp. 32–36.

Mark G. Johnson and Edwin L. Hudson, "A Variable Delay Line PLL for CPU–Coprocessor Synchronization", IEEE Journal of Solid–State Circuits, vol. 23, No. 5, Oct. 1988, pp. 1218–1223.

Ian A. Young, Jeffrey K. Greason and Keng L. Wong, "A PLL Clock Generator with 5 to 110 MHz of Lock Range for Microprocessors", IEEE Journal of Solid–State Circuits, vol. 27, No. 11, Nov. 1992, pp. 1599–1607.

Uming Ko, Shannon A. Wichman, Shawn Castrianni, "A 30–ps Jitter, 3.6–µs Locking 3.3–Volt Digital PLL for CMOS Gate Arrays", IEEE 1993 Custom Integrated Circuits Conference, pp. 23.3.1–23.3.4.

Florence Lee, "PLL Application Note", LSI Logic Corporation, Nov. 8, 1991, pp. 0–28.

*Primary Examiner*—Stephen Chin
*Assistant Examiner*—Joseph Roundtree
*Attorney, Agent, or Firm*—Limbach & Limbach L.L.P.

[57] ABSTRACT

A digital delay lock loop for generating frequency multiples of an input clock signal includes a programmable digital oscillator, a phase comparator, a programmable counter and delay control logic. The programmable digital oscillator is a ring connected programmable delay line and inverter which together generate an output clock signal having a frequency which depends upon the time delay of the programmable delay line. The phase comparator compares the phase of the output clock signal to that of a reference clock signal and generates a phase error signal which represents the phase difference between such signals. The programmable counter, programmed and reprogrammed with the arrival of every reference clock signal pulse, counts the output clock signal pulses to generate a count signal. The delay control logic, in response to the phase error signal and count signal, programs the time delay of the programmable delay line, thereby causing the output clock signal frequency to be the desired multiple of the reference clock frequency.

24 Claims, 4 Drawing Sheets

DIGITAL DELAY LOCK LOOP FOR CLOCK SIGNAL FREQUENCY MULTIPLICATION

RELATED APPLICATIONS

This application claims the benefit of U.S. Provisional Application No. 60/025,101, filed Aug. 29, 1996, and entitled "Clock Multiplying Digital Delay Lock Loop (DDLL)."

BACKGROUND OF THE INVENTION

1. Field of the Invention

The present invention relates to digital clock signal generators, and in particular, digital clock signal generators using digital delay lock loops and capable of multiplying the frequency of the subject clock signal.

2. Description of the Related Art

As the level of integration in digital integrated circuits (ICs) increases, the generation and distribution of the internal clock signals become more problematic. For example, distributing synchronous clock signals to many (e.g., thousands) registers throughout a very large scale integrated circuit can introduce significant clock skewing due to the parasitic resistive and capacitive loading of the clock signal lines.

One technique for minimizing clock skewing due to mass distribution of a synchronous clock signal is to use a phase lock loop (PLL) whereby a reference clock signal is distributed and used to generate and synchronize many local clock signals. The PLL can also be used to multiply the frequency of the reference clock signal, thereby generating local clock signals which are synchronous frequency multiples of the reference clock signal.

However, implementing a PLL in a typical digital IC is undesirable since the PLL 25 requires the use of analog circuits, such as a voltage controlled oscillator, phase detector, charge pump and low pass filter. These types of circuits require significant circuit area and often demonstrate relatively poor noise immunity.

Accordingly, it would be desirable to have a digital circuit which can be used more advantageously than an analog PLL in the generation and distribution of digital clock signals.

SUMMARY OF THE INVENTION

A digital delay lock loop (DDLL) for clock signal frequency multiplication in accordance with the present invention provides a digital circuit with a simple architecture for synchronously reproducing a clock signal which is a selective frequency multiple of the input clock signal.

In accordance with one embodiment of the present invention, a digital delay lock loop for generating frequency multiples of an input clock signal includes a programmable digital delay oscillator circuit, a phase comparison circuit, a digital counter and a delay controller. The programmable digital delay oscillator circuit is aconfigured to receive at least one delay control signal and a reference clock signal and in accordance therewith provide an output clock signal. The reference clock signal includes a reference clock signal frequency, the output clock signal includes an output clock signal frequency, the programmable digital delay oscillator circuit includes an internal signal delay which is controlled by the delay control signal and the output clock signal frequency is controlled by the internal signal delay. The phase comparison circuit is coupled to the programmable digital delay oscillator circuit and is configured to receive the reference clock signal and the output clock signal and in accordance therewith provide at least one phase comparison result signal. The reference clock signal further includes a reference clock signal phase, the output clock signal further includes an output clock signal phase and the phase comparison result signal represents a difference between the reference clock signal phase and the output clock signal phase. The digital counter is coupled to the programmable digital delay oscillator circuit and is configured to receive the reference clock signal and the output clock signal and in accordance therewith provide at least one digital count signal. The delay controller is coupled to the programmable digital delay oscillator circuit, the phase comparison circuit and the digital counter and is configured to receive the phase comparison result signal and the digital count signal and in accordance therewith provide the delay control signal.

These and other features and advantages of the present invention will be understood upon consideration of the following detailed description of the invention and the accompanying drawings.

DETAILED DESCRIPTION OF THE INVENTION

Figure 1:
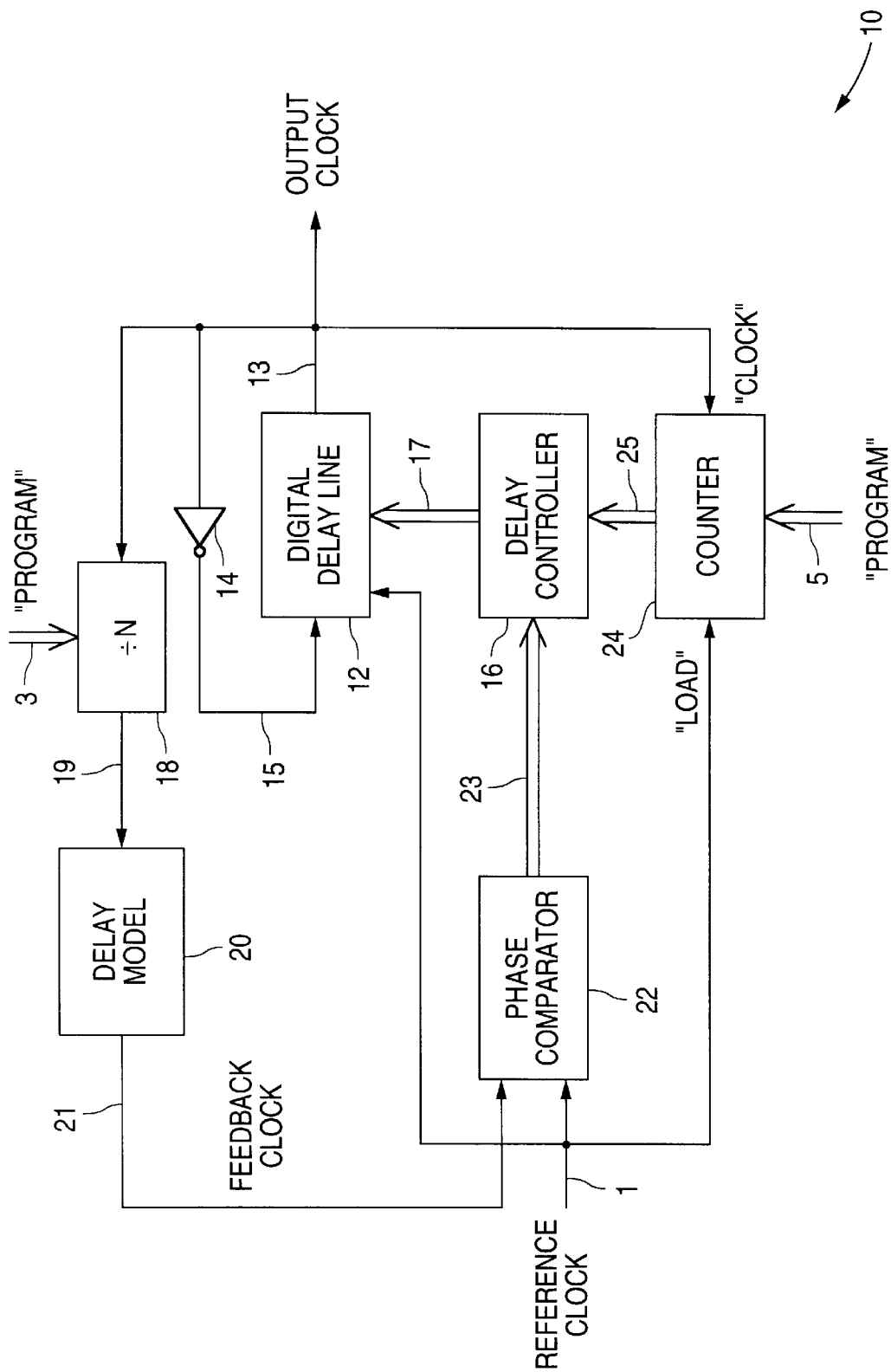
FIG. 1 is a functional block diagram of a digital delay lock loop for clock signal frequency multiplication in accordance with one embodiment of the present invention.

Referring to FIG. 1, a digital delay lock loop 10 for clock signal frequency multiplication in accordance with one embodiment of the present invention includes a ring oscillator in the form of a programmable digital delay line 12 and feedback inverter 14. The delay within the programmable digital delay line 12 is programmed once per reference clock 1 cycle in accordance with programming control signals 17 from a delay controller 16, and the output clock signal 13 from the delay line 12, following inversion by the inverter 14, is recirculated and delayed to within the delay line 12.

The output clock signal 13 is also selectively divided by a programmable frequency divider 18 which can be selectively programmed via an externally generated programming signal 3. The frequency divided clock signal 19 is delayed by a delay model circuit 20 which is selectively designed to simulate, i.e., model, the delay introduced to the output clock signal 13 elsewhere within the IC.

The resulting feedback clock signal 21 is compared in phase to an external reference clock signal 1 by a phase comparator 22. Based upon this phase comparison, the phase comparator 22 generates a set of control signals 23 for the delay controller 16. As discussed in more detail below, these control signals 23 assist the delay controller 16 in determining whether more delay, less delay or no change in delay is required within the delay line 12.

In establishing the programming signals 17 for the delay line 12, the delay controller 16 receives, in addition to the control signals 23 from the phase comparator 22, a set of output count state signals 25 from a counter 24. The counter 24 is loaded with an initial count value which is used to determine how many cycles of the output clock signal 13 are to be generated for each cycle of the reference clock signal 1. This initial count value can be provided by an externally generated programming signal 5 and is loaded once during each cycle of the reference clock signal 1. Using the output clock signal 13 as its "clock," the counter 24 will decrement its output count for each cycle of the output clock signal 13. Regardless of the value of its output count, the counter 24 synchronously reloads its original value on the next falling edge of the output clock signal 13 following a rising edge of the reference clock signal 1.

Hence, the operation of this digital delay lock loop 10 can be summarized as follows. The free running oscillator formed by the delay line 12 and inverter 14 generates the output clock signal 13 which is frequency divided and delayed for phase comparison with a reference clock signal 1 by a phase comparator 22. The delay controller 16, via the delay control signals 17, controls the delay within the delay line 12. If the internal delay of the delay line 12 is decreased, the frequency of the output clock signal 13 increases, and if the internal delay is increased, the output clock signal 13 frequency decreases. (Changes, if any, in the internal delay of the delay line 12, in accordance with the delay control signals 17, occur in response to the controlling, e.g., rising, edge of the reference clock signal 1.)

The counter 24 is initially loaded with a value to determine how many multiples of the reference clock 1 are to be generated to form the output clock 13. Following a rising edge of the reference clock signal 1, this value is synchronously loaded into the counter 24. The output count state signals 25 and the phase comparison result signals 23 are used by the delay controller 16 to determine if more or less delay is required within the delay line 12.

For example, if the counter 24 is initially loaded with a value of 4 after each reference clock 1 cycle, and it only decrements to a value of 3 prior to the next assertion of the reference clock 1, there is too much delay within the delay line 12. If the correct number of output clock signal 13 pulses occur during one cycle of the reference clock 1, the output count from the counter 24 will have a value of 1 at the next assertion of the reference clock 1. And, if there are too many pulses in the output clock signal 13 for each reference clock 1 cycle, the counter will decrement to zero and remain at zero, thereby indicating that the free running oscillator 12, 14 is running too fast and additional delay is required within the delay line 12.

Once the output clock signal 13 is running at the correct frequency multiple of the A reference clock 1, the phase comparator 22 assumes full control for any necessary fine tuning within the delay line 12 to ensure phase lock. Alternatively, the frequency divider 18 can be eliminated. Frequency division of the output clock signal 13 is not absolutely necessary since the counter 24 is monitoring the frequency of the output clock signal 13. However, experimentation has shown that, while not necessary, the frequency divider 18 is nonetheless desirable since it helps maintain stability of the overall circuit operation and reduces power consumption of the feedback path 18, 20 to the phase comparator 22 by only passing those clock edges which are important for maintaining phase lock. (Additionally, the delay model 20 is not necessary to operation of this circuit 10, and can be eliminated depending upon the application and use of the output clock signal 13.)

Figure 2:
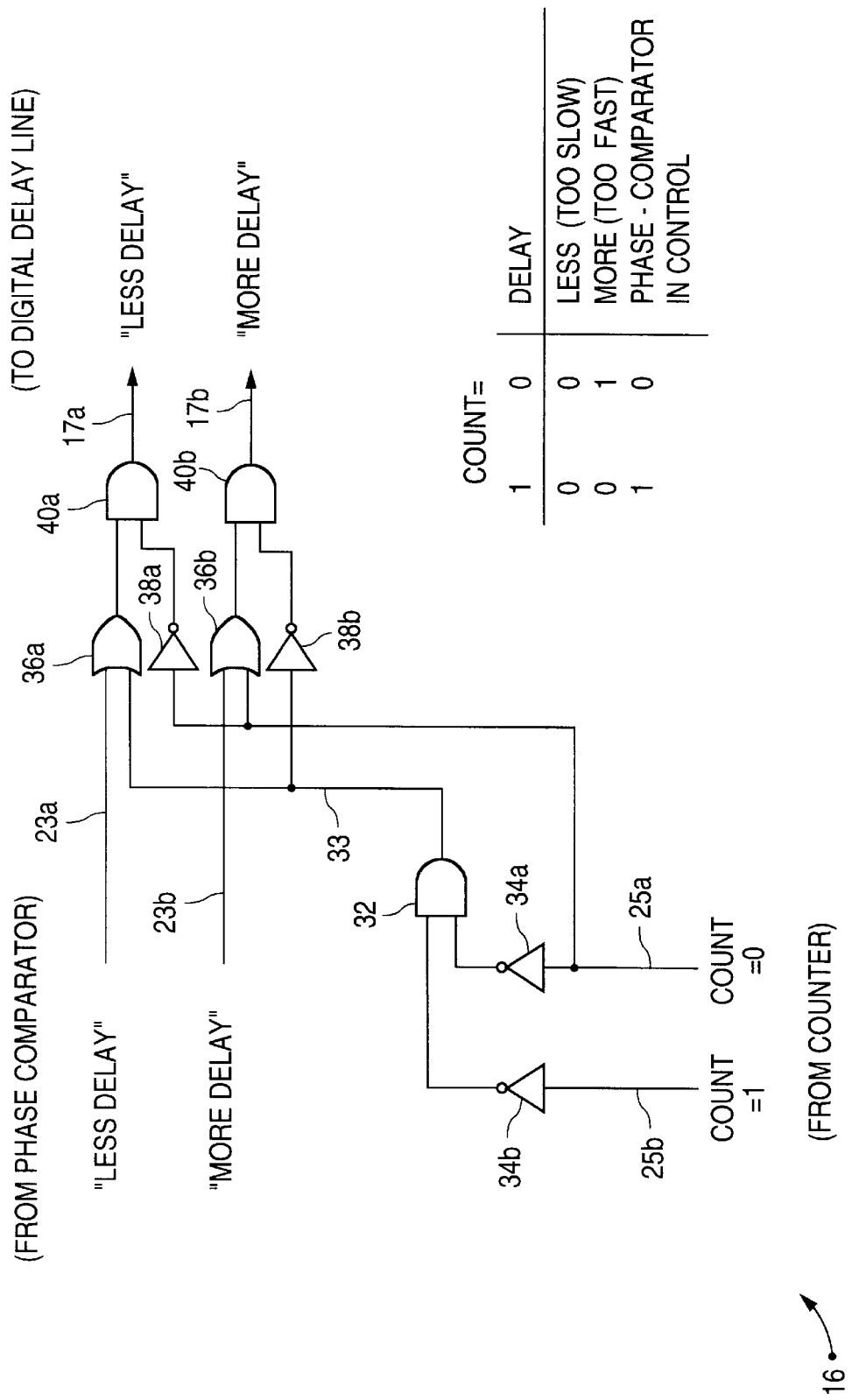
FIG. 2 is a logic diagram of the delay controller of FIG. 1.

Referring to FIG. 2, the delay controller 16 uses the phase comparison result signals 23 from the phase comparator 22 and output count state signals 25 from the counter 24 to generate the delay control signals 17 for the delay line 12.

Initially, the output count state signals 25a, 25b from the counter 24 control the generation of the delay control signals 17. The first output count state signal 25a is asserted when the output count of the counter 24 equals 0 (COUNT=0), the second output count state signal 25b is asserted when the output count of the counter 24 equals 1 (COUNT=1), and both signals 25a, 25b are deasserted when the output count is greater than 1 (COUNT>I). As discussed above, depending upon whether the output count of the counter 24 has a value of 0, 1 or greater than 1, the delay controller 16 programs the delay line 12 to have more or less delay.

If the output count of the counter 24 is greater than 1 (i.e., COUNT=0 and COUNT=1 are both de-asserted), then the oscillator 12, 14 is running too low in frequency; therefore, the output count state signals 25a, 25b override the control signals 23a, 23b from the phase comparator 22 and force assertion of the "less delay" signal 23a and deassertion of the "more delay" signal 23b. If the output count of the counter 24 is zero, (i.e., COUNT=0 is asserted and COUNT=1 is deasserted), then the oscillator 12, 14 is running too high in frequency; therefore, the output count state signals 25a, 25b override the control signals 23a, 23b from the phase comparator 22 and force deassertion of the "less delay" signal 23a and assertion of the "more delay" signal 23b. If the output count of the counter 24 is unity, (i.e., COUNT=0 is de-asserted and COUNT=1 is asserted), then the oscillator 12, 14 is running at approximately the correct frequency; therefore, the output count state signals 25a, 25b are both de-asserted and the control signals 23a, 23b from the phase comparator 22 control the internal delay of the delay line 12.

Figure 3:
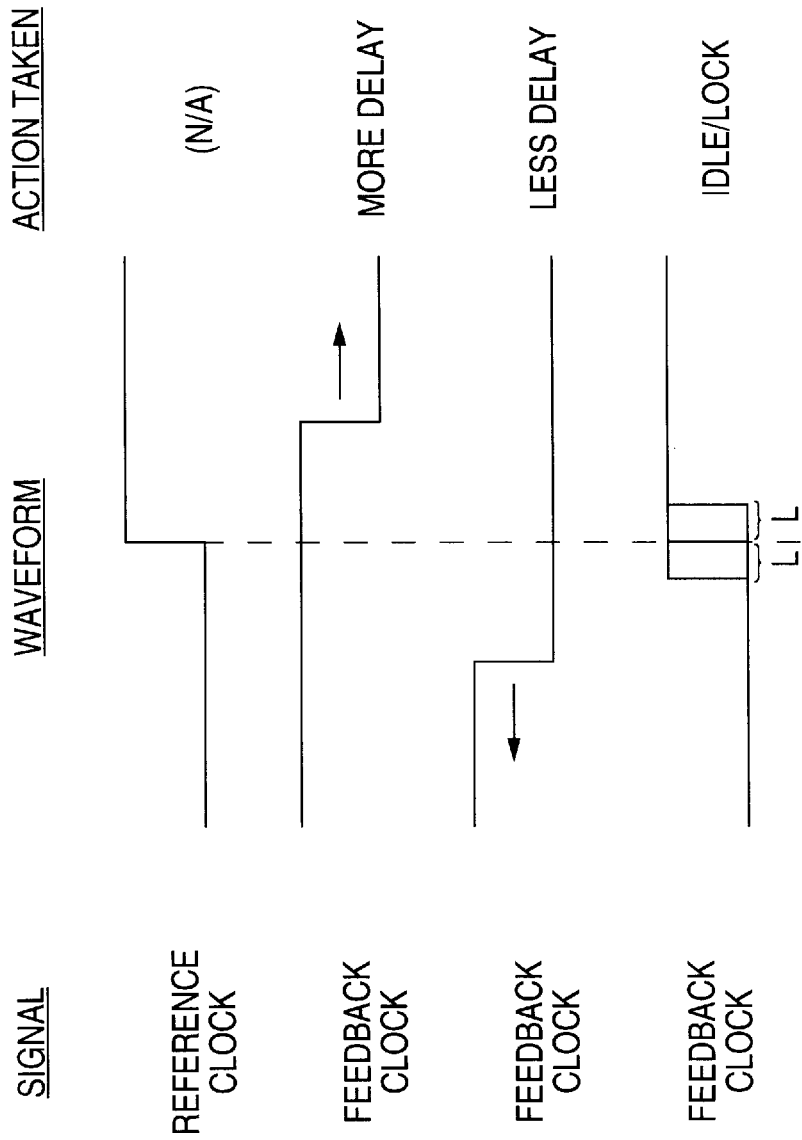
FIG. 3 is a timing diagram and chart illustrating the function performed by the phase comparator of FIG. 1.

Referring to FIG. 3, the result of the operation of the phase comparator 22 in increasing or decreasing the delay within the delay line 12 can be represented as shown. When the trailing edge of the feedback clock 21 is lagging the leading edge of the reference clock 1, more delay is introduced into the delay line 12 (FIG. 1) to bring the signals 21,1, closer to phase lock. Conversely, when the trailing edge of the feedback clock 21 leads the leading edge of the reference clock 1, the delay within the delay line 12 is reduced to bring them closer to phase lock. Finally, when the leading edge of the feedback clock 21 either leads or lags the leading edge of the reference clock 1 by a small, predetermined amount of time L, both delay control signals 23a, 23b (FIG. 2) from the phase comparator 22 remain deasserted.

Figure 4:
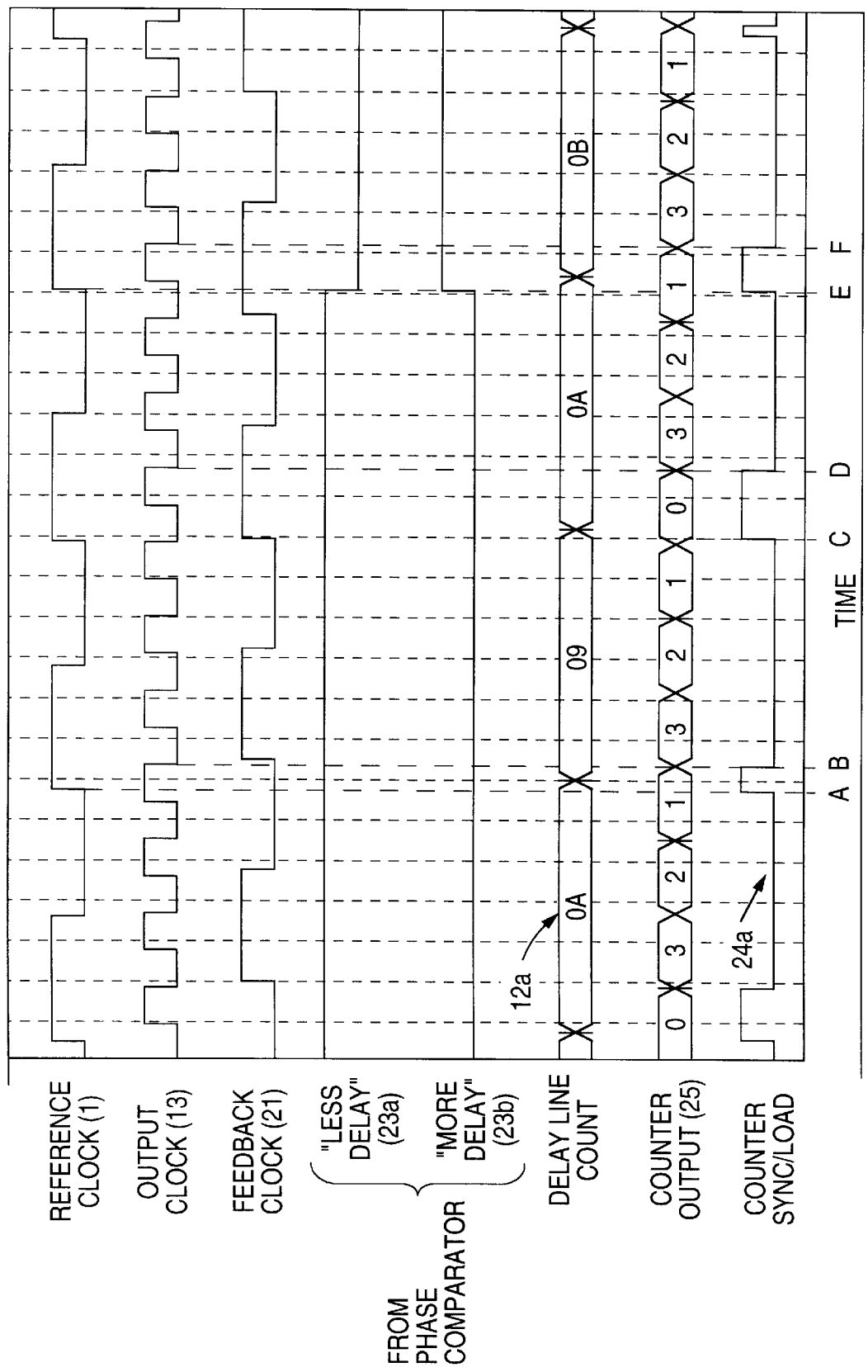
FIG. 4 is a signal timing diagram of various signals in the circuit of FIG. 1.

Referring to FIG. 4, the above discussed operation of the overall circuit 10 can be represented as shown. At time point A, the "less delay" control signal 23a (FIG. 2) generated by the phase comparator 22 (FIG. 1) is asserted and the "more delay" control signal 23b is de-asserted. Since the output count 25 has a value of 1, these signals 23a, 23b are in control. Accordingly, a synchronization/load signal 24a internal to the counter 24 is asserted during time interval A-B, thereby reloading the counter 24 with its initial value of 3 while clocking the delay line 12 and thereby reducing the amount of delay within the delay line 12 as represented by a delay line count 12a.

Subsequently at time point C, the output count 25 has decremented to a value of zero. Accordingly, the output count bits 25a, 25b assume control for adjusting the delay within the delay line 12, thereby causing any conflicting data via the control signals 23a, 23b from the phase comparator 22 to be ignored. Hence, as discussed above, the "more delay" control signal 17b is asserted and the "less delay" control signal 17a is deasserted. Accordingly, the internal counter synchronization/load signal 24a is asserted during time internal CD, thereby causing the initial counter value of 3 to again be reloaded.

Subsequently at time point E, when the counter output has decremented to a value lo of 1 and the output signals 23 from the phase comparator 22 have resumed control, the internal counter synchronization/load signal 24a is asserted during time internal EF, thereby causing the counter output value to once again be reset at its initial value of 3. Accordingly, since the "more delay" control signal 17b from the phase comparator has now become asserted, and the "less delay" control signal 17a has been deasserted, the delay line count 12a (representing the amount of delay within the delay line 12) increases.

In accordance with the foregoing discussion, a number of additional characteristics of a digital delay lock loop for clock signal frequency multiplication in accordance with the present invention should be noted. Although the programmable counter 24 (FIG. 1) has been described herein as providing a twobit wide output count state signal 25, thereby providing for output clock signal 13 frequencies which are 1X, 2X, 3X and 4X that of the reference clock signal 1 frequency, it should be understood that a larger counter 24 can be used with a correspondingly wider output count state signal 25 (e.g., four bits wide for providing output frequencies which are 1X, 2X, 3X, . . . , 16X that of the input frequency). Hence, a DDLL in accordance with the present invention can be selectively programmed to provide an output clock signal with a frequency which is virtually any desired multiple of the input reference clock signal frequency.

Further, from the foregoing discussion it can be seen that the counter 24 effectively functions as a digital lowpass filter by ensuring that the oscillator 12, 14 does not oscillate too high in frequency. Also, by overriding possibly incorrect phase information 23 from the phase comparator 22, the counter 24 (with its delay control signals 25) reduces the time needed for the DDLL 10 to become phase locked. While it is possible that the DDLL 10 may eventually achieve phase lock without the counter 24, it is also possible that it may not, and it is further possible that it may instead achieve phase lock at some undesirable frequency multiple (e.g., 4X instead of 2X, 6X instead of 3X, etc.) since the phase comparator 22 alone cannot detect the extra clock edges.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a digital delay lock loop for generating frequency multiples of an input clock signal, comprising:

a programmable digital delay oscillator circuit configured to receive at least one delay control signal and a reference clock signal and in accordance therewith provide an output clock signal, wherein said reference clock signal includes a reference clock signal frequency, said output clock signal includes an output clock signal frequency, said programmable digital delay oscillator circuit includes an internal signal delay which is controlled by said at least one delay control signal and said output clock signal frequency is controlled by said internal signal delay;

a phase comparison circuit, coupled to said programmable digital delay oscillator circuit, configured to receive said reference clock signal and said output clock signal and in accordance therewith provide at least one phase comparison result signal, wherein said reference clock signal further includes a reference clock signal phase, said output clock signal further includes an output clock signal phase and said at least one phase comparison result signal represents a difference between said reference clock signal phase and said output clock signal phase;

a digital counter, coupled to said programmable digital delay oscillator circuit, configured to receive said reference clock signal and said output clock signal and in accordance therewith provide at least one digital count signal; and a delay controller, coupled to said programmable digital delay oscillator circuit, said phase comparison circuit and said digital counter, configured to receive said at least one phase comparison result signal and said at least one digital count signal and in accordance therewith provide said at least one delay control signal.

2. The apparatus of claim 1, wherein said programmable digital delay oscillator circuit comprises:

a programmable digital delay line configured to be programmed in accordance with said at least one delay control signal and clocked in accordance with said reference clock signal and in accordance therewith receive and delay an inverted output clock signal to provide said output clock signal; and an inverter, coupled to said programmable digital delay line, configured to receive and invert said output clock signal to provide said inverted output clock signal.

3. The apparatus of claim 1, wherein said phase comparison circuit comprises:

a feedback circuit configured to receive and process said output clock signal and in accordance therewith provide a feedback clock signal; and a phase comparator, coupled to said feedback circuit, configured to receive and compare said reference clock signal and said feedback clock signal and in accordance therewith provide said at least one phase comparison result signal.

4. The apparatus of claim 3, wherein said feedback circuit comprises a frequency divider circuit configured to receive and frequency divide said output clock signal to provide said feedback clock signal.

5. The apparatus of claim 1, wherein said at least one digital count signal represents a count value which is indexed by said output clock signal.

6. The apparatus of claim 5, wherein said at least one digital count signal has an initial count value which is established in accordance with said reference clock signal.

7. The apparatus of claim 6, wherein said digital counter comprises a programmable digital counter and is further configured to receive at least one counter programming signal which represents said initial count value.

8. The apparatus of claim 1, wherein said delay controller comprises a plurality of digital logic gates and said at least one digital count signal includes at least one digital count signal value which selectively takes precedence over said at least one phase comparison result signal in said providing of said at least one delay control signal.

9. A method of providing an apparatus including a digital delay lock loop for generating frequency multiples of an input clock signal, said method comprising the steps of:

providing a programmable digital delay oscillator circuit for performing the step of receiving at least one delay control signal and a reference clock signal and in accordance therewith generating an output clock signal, wherein said reference clock signal includes a reference clock signal frequency, said output clock signal includes an output clock signal frequency, said programmable digital delay oscillator circuit includes an internal signal delay which is controlled by said at least one delay control signal and said output clock signal frequency is controlled by said internal signal delay;

providing a phase comparison circuit, coupled to said programmable digital delay oscillator circuit, for performing the step of receiving said reference clock signal and said output clock signal and in accordance therewith generating at least one phase comparison result signal, wherein said reference clock signal further includes a reference clock signal phase, said output clock signal further includes an output clock signal phase and said at least one phase comparison result signal represents a difference between said reference clock signal phase and said output clock signal phase;

providing a digital counter, coupled to said programmable digital delay oscillator circuit, for performing the step of receiving said reference clock signal and said output clock signal and in accordance therewith generating at least one digital count signal; and providing a delay controller, coupled to said programmable digital delay oscillator circuit, said phase comparison circuit and said digital counter, for performing the step of receiving said at least one phase comparison result signal and said at least one digital count signal and in accordance therewith generating said at least one delay control signal.

10. The method of claim 9, wherein said step of providing a programmable digital delay oscillator circuit comprises the steps of:

providing a programmable digital delay line for performing the step of programming said programmable digital delay line in accordance with said at least one delay control signal and clocking said programmable digital delay line in accordance with said reference clock signal and in accordance therewith receiving and delaying an inverted output clock signal to generate said output clock signal; and providing an inverter, coupled to said programmable digital delay line, for performing the step of receiving and inverting said output clock signal to generate said inverted output clock signal.

11. The method of claim 9, wherein said step of providing a phase comparison circuit comprises the steps of:

providing a feedback circuit for performing the step of receiving and processing said output clock signal and in accordance therewith generating a feedback clock signal; and providing a phase comparator, coupled to said feedback circuit, for performing the step of receiving and comparing said reference clock signal and said feedback clock signal and in accordance therewith generating said at least one phase comparison result signal.

12. The method of claim 11, wherein said step of providing a feedback circuit comprises providing a frequency divider circuit for performing the step of receiving and frequency dividing said output clock signal to generate said feedback clock signal.

13. The method of claim 9, wherein said at least one digital count signal represents a count value which is indexed by said output clock signal.

14. The method of claim 13, wherein said at least one digital count signal has an initial count value which is established in accordance with said reference clock signal.

15. The method of claim 14, wherein said step of providing a digital counter comprises providing a programmable digital counter for performing the step of programming said programmable digital counter with at least one counter programming signal which represents said initial count value.

16. The method of claim 9, wherein said step of providing a delay controller comprises providing a plurality of digital logic gates and said at least one digital count signal includes at least one digital count signal value which selectively takes precedence over said at least one phase comparison result signal in said generating of said at least one delay control signal.

17. A method of generating frequency multiples of an input clock signal with a digital delay lock loop, said method comprising the steps of:

receiving at least one delay control signal and a reference clock signal and in accordance therewith generating an output clock signal, wherein said reference clock signal includes a reference clock signal frequency, said output clock signal includes an output clock signal frequency and said output clock signal frequency is controlled by a signal delay which is controlled by said at least one delay control signal;

receiving said reference clock signal and said output clock signal and in accordance therewith generating at least one phase comparison result signal, wherein said reference clock signal further includes a reference clock signal phase, said output clock signal further includes an output clock signal phase and said at least one phase comparison result signal represents a difference between said reference clock signal phase and said output clock signal phase;

receiving said reference clock signal and receiving and counting said output clock signal and in accordance therewith generating at least one digital count signal; and receiving said at least one phase comparison result signal and said at least one digital count signal and in accordance therewith generating said at least one delay control signal.

18. The apparatus of claim 17, wherein said step of receiving at least one delay control signal and a reference clock signal and in accordance therewith generating an output clock signal comprises the steps of:

programming a programmable digital delay line in accordance with said at least one delay control signal and clocking said programmable digital delay line in accordance with said reference clock signal and in accordance therewith receiving and delaying an inverted output clock signal to generate said output clock signal; and receiving and inverting said output clock signal to generate said inverted output clock signal.

19. The apparatus of claim 17, wherein said step of receiving said reference clock signal and said output clock signal and in accordance therewith generating at least one phase comparison result signal comprises the steps of:

receiving and processing said output clock signal and in accordance therewith generating a feedback clock signal; and receiving and comparing said reference clock signal and said feedback clock signal and in accordance therewith generating said at least one phase comparison result signal.

20. The apparatus of claim 19, wherein said step of receiving and processing said output clock signal and in accordance therewith generating a feedback clock signal comprises receiving and frequency dividing said output clock signal to generate said feedback clock signal.

21. The apparatus of claim 17, wherein said at least one digital count signal represents a count value which is indexed by said output clock signal.

22. The apparatus of claim 21, wherein said at least one digital count signal has an initial count value which is established in accordance with said reference clock signal.

23. The apparatus of claim 22, wherein said step of receiving said reference clock signal and receiving and counting said output clock signal and in accordance therewith generating at least one digital count signal comprises receiving at least one programming signal which represents said initial count value and in accordance therewith counting said output clock signal to generate said at least one digital count signal.

24. The apparatus of claim 17, wherein said at least one digital count signal includes at least one digital count signal value which selectively takes precedence over said at least one phase comparison result signal in said generating of said at least one delay control signal.

* * * * *